(12) United States Patent
Lam

(10) Patent No.: US 9,362,870 B2
(45) Date of Patent: Jun. 7, 2016

(54) APPARATUS AND METHODS FOR BIASING POWER AMPLIFIERS

(71) Applicant: SKYWORKS SOLUTIONS, INC., Woburn, MA (US)

(72) Inventor: Lui Lam, Lexington, MA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

(21) Appl. No.: 14/448,793

(22) Filed: Jul. 31, 2014

(65) Prior Publication Data
US 2015/0035605 A1  Feb. 5, 2015

Related U.S. Application Data

(60) Provisional application No. 61/861,309, filed on Aug. 1, 2013.

(51) Int. Cl.
| | | |
|---|---|---|
| *H03F 3/19* | (2006.01) | |
| *H03F 3/21* | (2006.01) | |
| *H03F 3/04* | (2006.01) | |
| *H03F 1/02* | (2006.01) | |
| *H03F 3/24* | (2006.01) | |

(52) U.S. Cl.
CPC ............... *H03F 3/19* (2013.01); *H03F 1/0266* (2013.01); *H03F 3/211* (2013.01); *H03F 3/245* (2013.01); *H03F 2200/18* (2013.01); *H03F 2200/451* (2013.01); *H03F 2203/21131* (2013.01)

(58) Field of Classification Search
USPC .................................. 330/285, 296, 289, 51
See application file for complete search history.

(56) References Cited

U.S. PATENT DOCUMENTS

| | | | |
|---|---|---|---|
| 6,331,799 B1 | 12/2001 | Miyazawa | |
| 7,821,335 B2 | 10/2010 | Shiramizu et al. | |
| 7,869,775 B2 | 1/2011 | Alon et al. | |
| 8,093,952 B2* | 1/2012 | Behzad | H03F 1/1301 330/285 |
| 8,717,101 B2 | 5/2014 | Li et al. | |
| 2005/0032488 A1 | 2/2005 | Pehlke et al. | |
| 2005/0134374 A1 | 6/2005 | Hench et al. | |
| 2008/0180169 A1 | 7/2008 | Ripley et al. | |

(Continued)

FOREIGN PATENT DOCUMENTS

| | | |
|---|---|---|
| JP | 2000-252766 | 9/2000 |
| JP | 2007-019784 | 1/2007 |

OTHER PUBLICATIONS

International Search Report of Nov. 14, 2014 for International Patent Application No. PCT/US2014/049487 filed on Aug. 1, 2014. 12 pages.

*Primary Examiner* — Hieu Nguyen
(74) *Attorney, Agent, or Firm* — Knobbe Martens Olson & Bear LLP

(57) ABSTRACT

Apparatus and methods for biasing power amplifiers are disclosed herein. In certain implementations, a power amplifier system includes a power amplifier and a bias circuit that generates a bias voltage for biasing the power amplifier. The bias circuit includes an amplifier, a current source for generating a reference current, and a reference transistor having a current therethrough that changes in relation to the bias voltage. The amplifier can control the bias voltage based on an error current corresponding to a difference between the reference current and the current through the reference transistor. The amplifier can be used to control the bias voltage such that the reference current and the current through the reference transistor are substantially equal.

20 Claims, 9 Drawing Sheets

(56) References Cited

U.S. PATENT DOCUMENTS

| | | |
|---|---|---|
| 2009/0195318 A1 | 8/2009 | Kang et al. |
| 2010/0156539 A1 | 6/2010 | Ha et al. |
| 2012/0286873 A1 | 11/2012 | Li et al. |
| 2013/0141167 A1 | 6/2013 | Kim et al. |
| 2015/0077187 A1 | 3/2015 | Lam et al. |
| 2015/0180518 A1 | 6/2015 | Whittaker |

* cited by examiner

APPARATUS AND METHODS FOR BIASING POWER AMPLIFIERS

CROSS-REFERENCE TO RELATED APPLICATIONS

This application claims the benefit of priority under 35 U.S.C. §119(e) of U.S. Provisional Patent Application No. 61/861,309, filed Aug. 1, 2013 entitled "APPARATUS AND METHODS FOR BIASING POWER AMPLIFIERS", which is herein incorporated by reference in its entirety.

BACKGROUND

1. Field

Embodiments of the invention relate to electronic systems, and in particular, to radio frequency (RF) electronics.

2. Description of the Related Technology

RF power amplifiers can be used to boost the power of an RF signal having a relatively low power. Thereafter, the boosted RF signal can be used for a variety of purposes, included driving the antenna of a transmitter.

Power amplifiers can be included in mobile phones to amplify an RF signal for transmission. For example, in mobile phones that communicate using a cellular standard, a wireless local area network (WLAN) standard, and/or any other suitable communication standard, a power amplifier can be used to amplify the RF signal. It can be important to manage the amplification of an RF signal, as amplifying the RF signal to an incorrect power level or introducing significant distortion of the original RF signal can cause a wireless device to transmit out of band or violate compliance with accepted standards. Biasing of a power amplifier device is an important part of managing the amplification because it can determine the voltage and/or current operating point of the amplifying devices within the power amplifier.

There is a need for improved power amplifier systems. Furthermore, there is a need for improving power amplifier biasing.

SUMMARY

In certain embodiments, the present disclosure relates to a power amplifier system. The power amplifier system includes a power amplifier configured to receive a radio frequency (RF) input signal, and to amplify the RF input signal to generate an RF output signal. The power amplifier is further configured to receive a bias voltage that biases the power amplifier. The power amplifier system further includes a bias circuit configured to generate the bias voltage. The bias circuit includes a bias circuit amplifier, a current source configured to generate a reference current, and a reference transistor having a current therethrough that changes in relation to the bias voltage. The bias circuit amplifier is configured to control the bias voltage based on an error current corresponding to a difference between the reference current and the current through the reference transistor.

In some embodiments, the bias circuit amplifier includes a transimpedance amplifier.

In various embodiments, the bias circuit is configured to receive an enable signal, and the bias circuit is configured to selectively turn on or off the power amplifier based on a state of the enable signal. In a number of embodiments, at least one of the bias circuit amplifier or the current source turns on or off based on the state of the enable signal.

According to certain embodiments, the power amplifier includes a bipolar power amplifier transistor including a base that receives the bias voltage. In some embodiments, the power amplifier system further includes an array of transistor elements, and the bipolar power amplifier transistor is implemented by a plurality of transistor elements of the array, and the reference transistor is implemented by one or more transistor elements of the array. According to various embodiments, the bipolar power amplifier transistor and the reference transistor are separated by a distance of less than about 9 μm to provide thermal coupling. In accordance with a number of embodiments, the power amplifier system further includes an isolation circuit electrically connected between the base of the bipolar power amplifier transistor and an output of the bias circuit amplifier.

In several embodiments, the power amplifier includes a plurality of power amplifier stages arranged in a cascade.

According to some embodiments, the current source is a variable current source. In various embodiments, the power amplifier system further includes a control circuit configured to control the reference current generated by the variable current source to compensate for temperature variation.

In certain embodiments, the present disclosure relates to a method of biasing a power amplifier. The method includes generating a reference current using a current source, controlling a current through a reference transistor based on a bias voltage, generating an error current based on a difference between the reference current and the current through the reference transistor, controlling a voltage level of the bias voltage based on amplifying the error current using a bias circuit amplifier, and biasing a power amplifier using the bias voltage.

In various embodiments, controlling the voltage level of the bias voltage includes generating the bias voltage by amplifying the error current using a transimpedance amplifier.

According to some embodiments, controlling the voltage level of the bias voltage includes using negative feedback to control the current through the reference transistor to substantially equal the reference current.

In several embodiments, the method includes pulsing an output of the power amplifier by selectively activating at least one of the current source or the bias circuit amplifier using an enable signal.

In certain embodiments, the present disclosure relates to a power amplifier bias circuit for biasing a power amplifier. The power amplifier bias circuit includes a bias circuit amplifier, a current source configured to generate a reference current, and a reference transistor having a current therethrough that changes in relation to a bias voltage. The bias circuit amplifier is configured to control the bias voltage based on an error current corresponding to a difference between the reference current and the current through the reference transistor.

According to some embodiments, the bias circuit amplifier includes a transimpedance amplifier.

In various embodiments, the current source is a variable current source. In some embodiments, the bias circuit amplifier further includes a control circuit configured to control the reference current generated by the variable current source to compensate for temperature variation.

In several embodiments, at least one of the bias circuit amplifier or the current source are turned on or off using an enable signal.

In certain embodiments, the present disclosure relates to a power amplifier system. The power amplifier system includes a bipolar power amplifier transistor having a base configured to receive an RF signal and a collector configured to generate an amplified RF signal. The base of the bipolar power amplifier transistor is further configured to receive a bias voltage.

The power amplifier system further includes a bias circuit configured to generate the bias voltage. The bias circuit includes a bias circuit amplifier, a current source configured to generate a reference current, and a bipolar reference transistor having a base configured to receive the bias voltage and a collector configured to generate a collector current. The bias circuit amplifier is configured to control the bias voltage based on a difference between the reference current and the collector current.

DETAILED DESCRIPTION OF EMBODIMENTS

The headings provided herein, if any, are for convenience only and do not necessarily affect the scope or meaning of the claimed invention.

Apparatus and methods for biasing power amplifiers are disclosed herein. In certain implementations, a power amplifier system including a power amplifier and a bias circuit is provided. The power amplifier can be used to amplify a radio frequency (RF) signal for transmission, and the bias circuit can be used to generate a bias voltage for biasing the power amplifier. The power amplifier bias circuit can receive an enable signal that can be used to enable or disable the power amplifier so as to pulse the power amplifier's output.

In certain implementations, the bias circuit includes an amplifier, a current source for generating a reference current, and a reference transistor having a current therethrough that changes in relation to the bias voltage. The amplifier can control the bias voltage based on an error current corresponding to a difference between the reference current and the current through the reference transistor. For example, the amplifier can be used to control the bias voltage such that the reference current and the current through the reference transistor are substantially equal.

By configuring the bias circuit in this manner, the bias circuit can generate a bias voltage that changes dynamically over time to control the current through the reference transistor to be substantially equal to the reference current. The power amplifier can be biased based on the bias voltage such that the power amplifier has a substantially flat gain response versus time. Correcting for gain variation in the power amplifier can improve the power amplifier's performance, including, for example, the power amplifier's dynamic error vector magnitude (DEVM). In certain configurations, the bias circuit can also be used to compensate for variation in other power amplifier parameters, including, for example, variation in the power amplifier's phase across temperature.

Overview of Examples of Power Amplifier Systems

Figure 1:
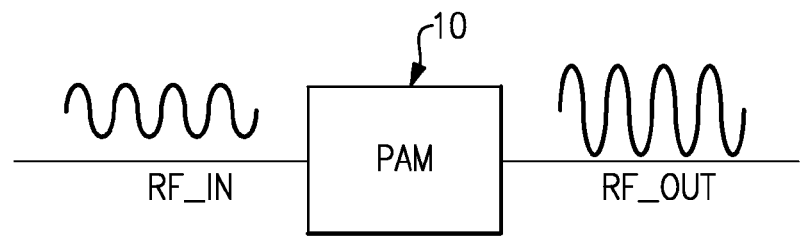
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 can be configured to amplify an RF signal RF_IN to generate an amplified RF signal RF_OUT. As described herein, the power amplifier module 10 can include one or more power amplifiers, including, for example, multi-stage power amplifiers.

Figure 2:
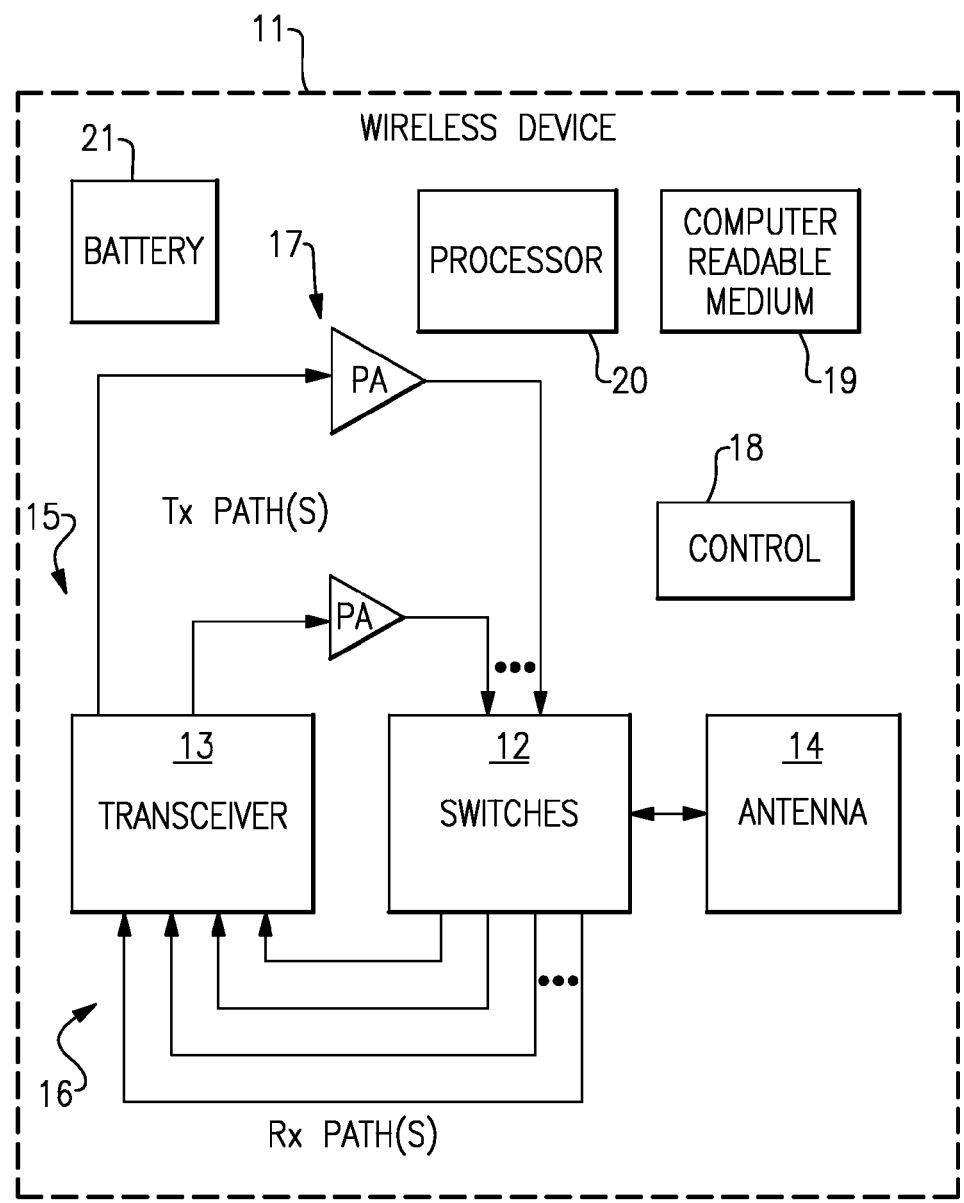
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include power amplifier bias circuits implementing one or more features of the present disclosure.

The example wireless device 11 depicted in FIG. 2 can represent a multi-band and/or multi-mode device such as a multi-band/multi-mode mobile phone. In the illustrated configuration, the wireless device 11 includes switches 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal. In certain configurations, one or more of the power amplifiers 17 are configured to amplify a Wi-Fi signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain configurations, the switches 12 can include a number of switches that provide functionalities associated with, for example, switching between different bands, switching between different power modes, switching between transmission and receiving modes, or some combination thereof. The switches 12 can also provide additional functionality, including filtering and/or duplexing of signals.

FIG. 2 shows that in certain configurations, a control component 18 can be provided for controlling various control functionalities associated with operations of the switches 12, the power amplifiers 17, and/or other operating component(s), such as bias circuits. Non-limiting examples of the control component 18 are described herein in greater detail.

In certain configurations, a processor 20 can be configured to facilitate implementation of various processes described herein. The processor 20 can operate using computer program instructions. These computer program instructions may be provided to the processor 20.

In certain configurations, these computer program instructions may also be stored in a computer-readable memory 19 that can direct the processor 20 or other programmable data processing apparatus to operate in a particular manner.

The battery 21 can be any suitable battery for use in the wireless device 11, including, for example, a lithium-ion battery.

Figure 3:
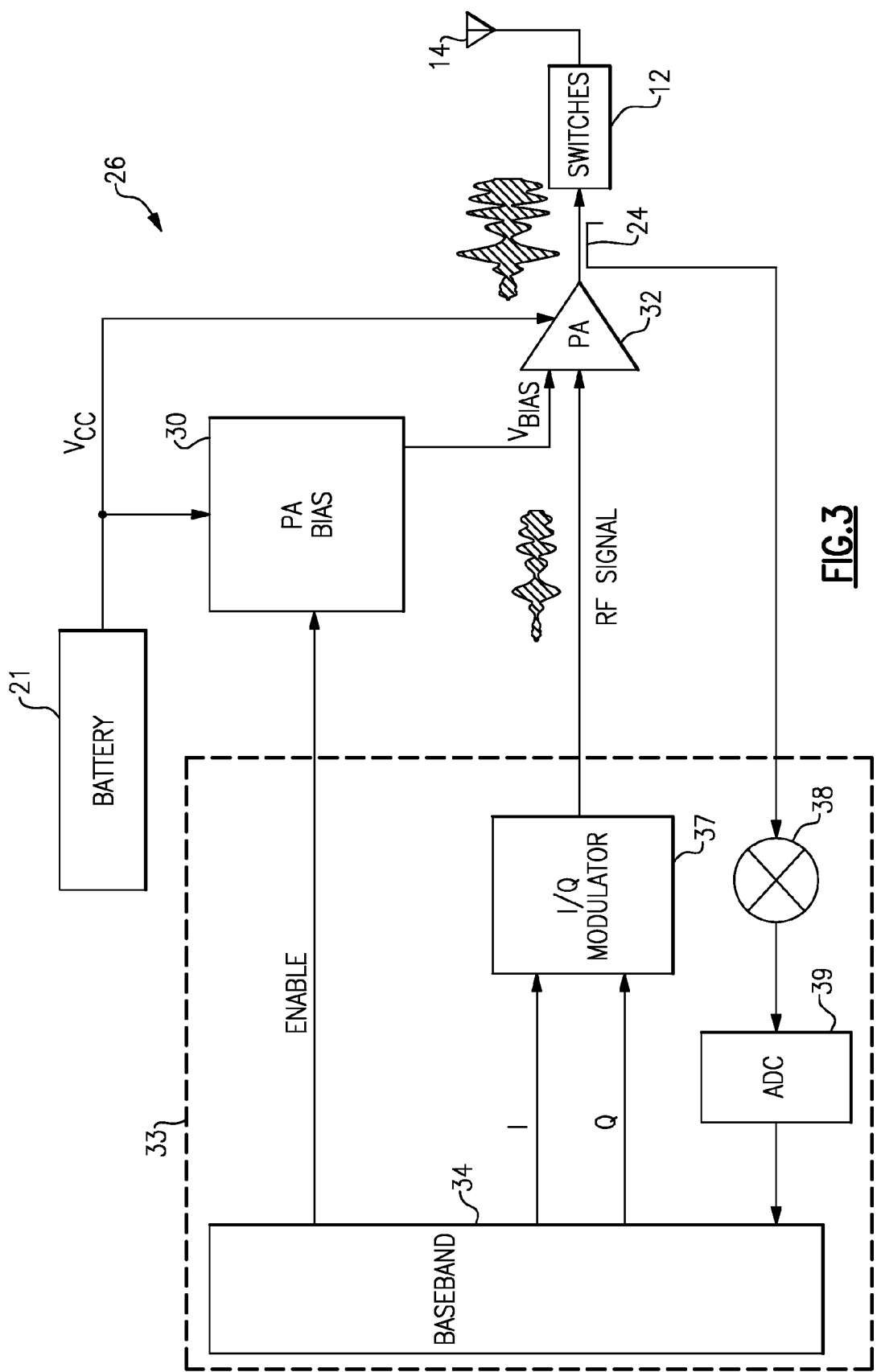
FIG. 3 is a schematic block diagram of one example of a power amplifier system.

FIG. 3 is a schematic block diagram of one example of a power amplifier system 26. The illustrated power amplifier system 26 includes the switches 12, the antenna 14, the battery 21, a directional coupler 24, a power amplifier bias circuit 30, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 30 can receive an enable signal ENABLE from the baseband processor 34 and a battery or power high voltage $V_{CC}$ from the battery 21, and can use the enable signal ENABLE to generate a bias voltage $V_{BIAS}$ for the power amplifier 32.

Although FIG. 3 illustrates the battery 21 directly generating the power high voltage $V_{CC}$, in certain implementations the power high voltage $V_{CC}$ can be a regulated voltage generated by a regulator that is powered using the battery 21. In one example, a switching regulator, such as a buck and/or boost converter, can be used to generate the power high voltage $V_{CC}$.

The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34.

By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32.

Figure 4:
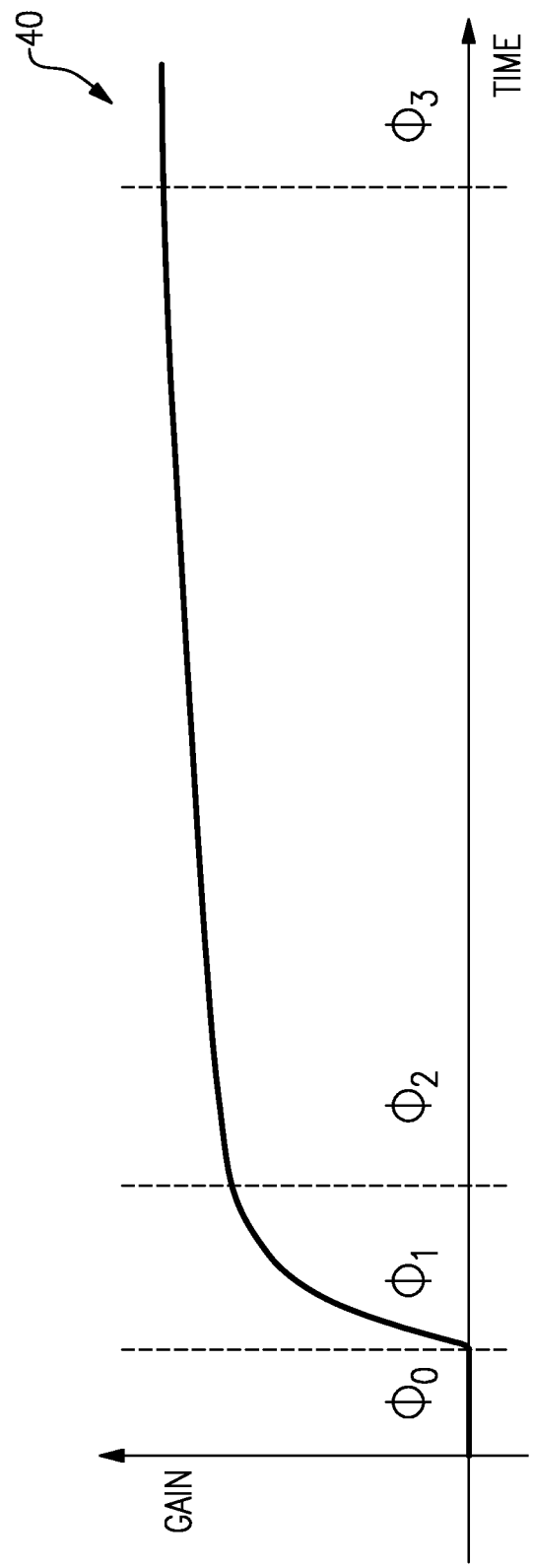
FIG. 4 is a graph of one example of power amplifier gain versus time.

FIG. 4 is a graph 40 of one example of power amplifier gain versus time. The graph 40 includes an initial phase $\Phi_0$, in which the power amplifier is disabled and has a relatively low gain, such as a gain of about 0. At the end of the initial phase $\Phi_0$, the power amplifier is enabled. For example, the initial phase $\Phi_0$ can end in response to transitioning the enable signal ENABLE shown in FIG. 3 from a deactivated state to an activated state.

As shown in FIG. 4, after being enabled, the power amplifier can have a time-dependent gain associated with the power amplifier operating in different phases associated with different gain amounts. For example, the power amplifier can include a first phase $\Phi_1$, in which the power amplifier's gain can begin to settle based on a dominant influencing factor. Additionally, the power amplifier can include a second phase $\Phi_2$ in which gain can further settle based on one or more non-dominant influencing factors. Furthermore, in a third phase $\Phi_3$, the power amplifier's gain can be settled and substantially constant. In the third phase $\Phi_3$, the power amplifier amplifier's error vector magnitude (EVM) can correspond to the power amplifier's static error vector magnitude (SEVM).

A power amplifier's gain can settle over time for a variety of reasons. For example, physical circuit limitations may prevent an amplifier from turning on instantaneously. Additionally, when the power amplifier is activated, the power amplifier may begin to heat, which can lead to a thermal transient that changes the performance characteristics of the power amplifier's circuitry. The thermal transient can be affected by a variety of factors, including self-heating of devices, mutual heating of devices, thermal mismatch between devices, and/or cross-die heat transfer.

In certain applications, a power amplifier can provide amplification before the gain of the power amplifier is fully settled. For example, the power amplifier may provide amplification during the second phase $\Phi_2$, since the power amplifier's thermal time constant may be much longer than the amplifier's rated or specified turn-on time. Before the power amplifier's gain is settled, the power amplifier can have a dynamic error vector magnitude (DEVM) that can be worse that the power amplifier's SEVM.

From a system perspective, the distortion associated with amplifying an RF input signal using a power amplifier can be represented by either the DEVM or SEVM figure of merit (FOM).

It can be undesirable for a power amplifier to have a time-dependent gain after turn on. For example, when a power amplifier has a time-dependent gain, the distortion that the RF input signal undergoes during amplification can be different shortly after the power amplifier is activated relative to when the power amplifier has reached a steady-state gain condition. Since a receiver demodulation level can be set during a preamble, any change in gain after the receiver demodulation level is set can cause error and poor EVM.

Although FIG. 4 illustrates the power amplifier's gain changing across time, persons having ordinary skill in the art will appreciate that other parameters of the power amplifier can change with time, including, for example, the power amplifier's phase. The teachings herein are applicable not only to provide gain correction, but also to provide other types of correction, such as phase correction.

Figure 5A:
FIGS. 5A-5B are graphs of two examples of power amplifier gain versus time.
Figure 5B:
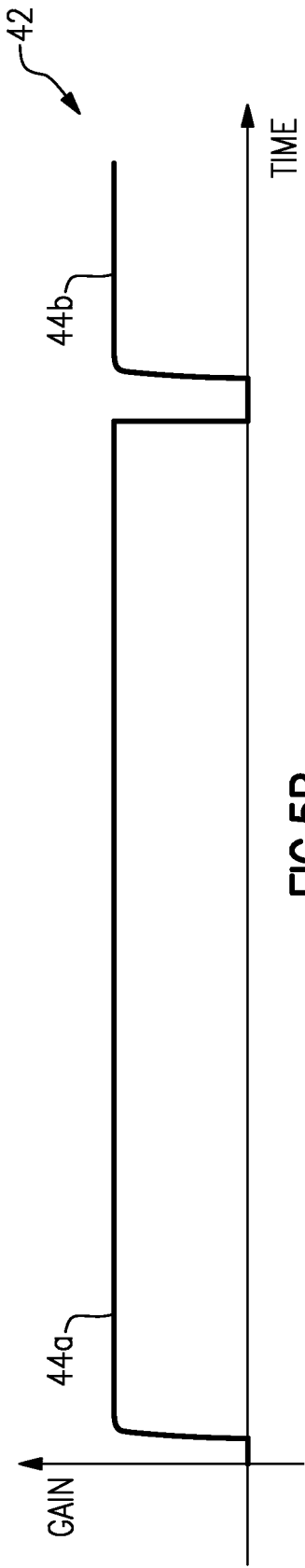

FIGS. 5A-5B are graphs of two examples of power amplifier gain versus time. FIG. 5A includes a first graph 41 of power amplifier gain versus time, and FIG. 5B includes a second graph 42 of power amplifier gain versus time.

The first graph 41 of FIG. 5A illustrates a configuration in which a power amplifier is turned off for a relatively long duration between activation events or pulses. For example, the first graph 41 includes a first activation event 43a and a second activation event 43b that are separated by a relatively long delay. In contrast, the second graph 42 of FIG. 5B illustrates a configuration in which a power amplifier is turned off for a relatively brief duration between activation events. For example, the second graph 42 includes a first activation event 44a and a second activation event 44 that are separately by a relatively short delay.

In the configuration shown in FIG. 5A, the temperature of the power amplifier can be relatively cold at the start of the second activation event 43b, since the duration of time between the first and second activation events 43a, 43b is relatively long. The relatively cold temperature of the power amplifier can increase the impact of transient gain effects associated with pulsing operations of the power amplifier. In contrast, in the configuration shown in FIG. 5B, the temperature of the power amplifier can be relatively hot at the start of the second activation event 44b, which can result in the power amplifier having a relatively small amount of transient gain effects.

Absent compensation, the DEVM of the power amplifier can vary based on the pulsing operations of the power amplifier, including, for example, an off-time between pulses and/or a duty cycle of the pulses. The time dependence of the power amplifier's gain and/or phase on pulsing operations can make it difficult to compensate for the power amplifier's DEVM using static techniques, such as resistor-capacitor (RC) compensation.

Figure 6:
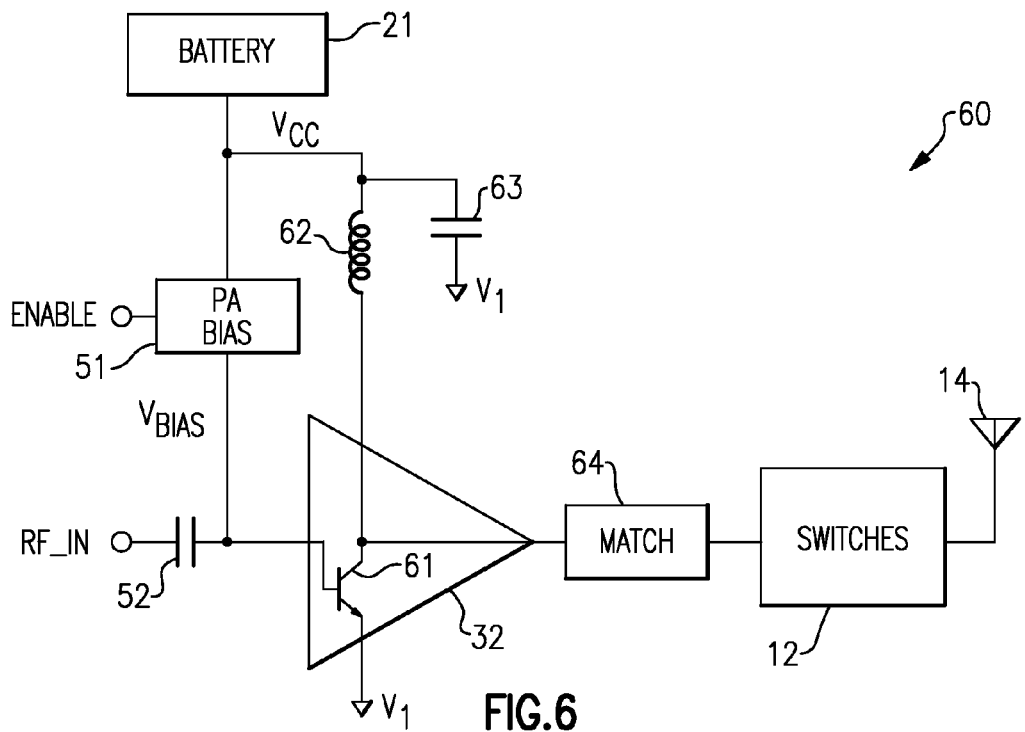
FIG. 6 is a schematic block diagram of another example of a power amplifier system.

FIG. 6 is a schematic block diagram of another example of a power amplifier system 60. The illustrated power amplifier system 60 includes a power amplifier bias circuit 51, the battery 21, the power amplifier 32, an inductor 62, a decoupling capacitor 63, a DC blocking capacitor 52, an impedance matching block 64, the switches 12, and the antenna 14.

The illustrated power amplifier 32 includes a bipolar power amplifier transistor 61 having an emitter, a base, and a collector. The emitter of the bipolar power amplifier transistor 61 can be electrically connected to a first or power low voltage $V_1$, which can be, for example, a ground supply. Additionally, a radio frequency (RF) input signal RF_IN can be provided to the base of the bipolar power amplifier transistor 61 through the DC blocking capacitor 52. The bipolar power amplifier transistor 61 can amplify the RF input signal RF_IN and provide the amplified RF signal at the collector. The bipolar power amplifier transistor 61 can be any suitable device. In one implementation, the bipolar power amplifier transistor 61 is a heterojunction bipolar transistor (HBT).

The power amplifier 32 can be configured to provide the amplified RF signal to the switches 12. Although illustrated for a configuration using a single stage, the power amplifier 32 can be adapted to include multiple stages.

The battery 21 can be any suitable battery, such as a lithium-ion battery, and be used to provide the power high voltage $V_{CC}$ to the power amplifier 32 and, in certain configurations, to the power amplifier bias circuit 51. Although the power amplifier system 60 illustrates the battery 21 as directly generating the power high voltage $V_{CC}$, in certain configurations, the power amplifier system 60 can include a regulator that is used to generate the power high voltage $V_{CC}$. Accordingly, the teachings herein are applicable to configurations in which a power amplifier is powered directed using a battery voltage and to configurations in which a power amplifier is powered using a regulated voltage.

The impedance matching block 64 can be used to aid in terminating the electrical connection between the output of the power amplifier 32 and an input of the switches 12. For example, the impedance matching block 64 can be used to increase power transfer and/or reduce reflections of the amplified RF signal.

The inductor 62 can be included to aid in powering the power amplifier 32 with the power high voltage $V_{CC}$ while choking or blocking high frequency RF signal components. The inductor 62 can include a first end electrically connected to the power high voltage $V_{CC}$ and a second end electrically connected to the collector of the bipolar power amplifier transistor 61. The decoupling capacitor 63 is electrically connected between the power high voltage $V_{CC}$ and the power low voltage $V_1$ and can provide a low impedance path to high frequency signals, thereby reducing the noise of the power high voltage $V_{CC}$, improving power amplifier stability, and/or improving the performance of the inductor 62 as an RF choke.

The power amplifier bias circuit 51 is configured to receive an enable signal ENABLE and the power high voltage $V_{CC}$. The power amplifier bias circuit 51 can use the enable signal ENABLE to generate a bias voltage $V_{BIAS}$ for biasing the power amplifier 32. For example, as illustrated in FIG. 6, the power amplifier bias circuit 51 can be used to generate a bias voltage $V_{BIAS}$ that can be used to bias the base of the bipolar power amplifier transistor 61 of the power amplifier 32.

The power amplifier bias circuit 51 can use the enable signal ENABLE to control a magnitude of the bias voltage $V_{BIAS}$ over time so as to enable or disable the power amplifier and thereby pulse the power amplifier's output. For example, when the enable signal ENABLE indicates the power amplifier 32 should be activated, the power amplifier bias circuit 51 can change the amplitude of the bias voltage $V_{BIAS}$ so as to achieve a desired gain of the power amplifier 32. Similarly, when the enable signal ENABLE indicates that the power amplifier 32 should be deactivated, the power amplifier bias circuit 51 can decrease the bias voltage $V_{BIAS}$ such that the gain of the power amplifier 32 is relative low, for example, about 0.

Although FIG. 6 illustrates one implementation of the power amplifier 32, skilled artisans will appreciate that the teachings described herein can be applied to a variety of power amplifier structures, including, for example, multi-stage power amplifier structures and/or power amplifiers employing other transistor structures.

Overview of Power Amplifier Bias Circuits

Figure 7:
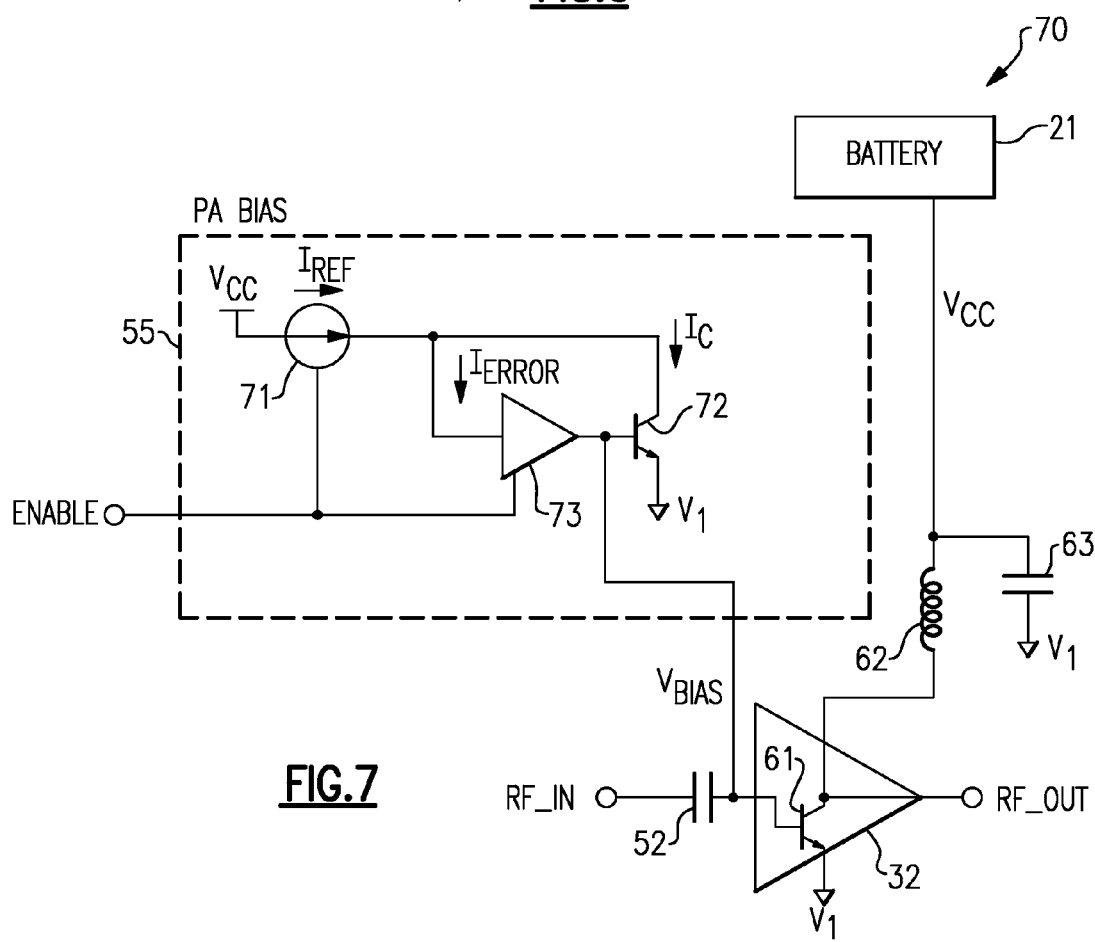
FIG. 7 is a circuit diagram of one embodiment of a power amplifier system.

FIG. 7 is a circuit diagram of a power amplifier system 70 according to one embodiment. The power amplifier system 70 includes the battery 21, the power amplifier 32, the DC blocking capacitor 52, the inductor 62, and the decoupling capacitor 63, which can be as described earlier. The power amplifier system 70 further includes a power amplifier bias circuit 55.

The power amplifier bias circuit 55 includes a current source 71, a bipolar reference transistor 72, and a bias circuit amplifier or amplifier 73. The current source 71 is configured to generate a reference current $I_{REF}$, and the bipolar reference transistor 72 has a collector current $I_C$. As shown in FIG. 7, the amplifier 73 includes an input configured to receive an error current $I_{ERROR}$, which can correspond to a difference between the reference current $I_{REF}$ and the collector current $I_C$. The amplifier 73 further includes an output configured to generate a bias voltage $V_{BIAS}$, which can be provided to the base of the bipolar reference transistor 72 and to the base of the bipolar power amplifier transistor 61.

In certain configurations, the power amplifier bias circuit 55 and the power amplifier 32 can be integrated on a single die with one or more other components to form a packaged power amplifier module, which can be, for example, mounted or attached to an RF circuit board associated a wireless device, such as the wireless device 11 of FIG. 2.

As shown in FIG. 7, the amplifier 73 can be used to control a voltage level of the bias voltage $V_{BIAS}$. Additionally, the amplifier 73 and the bipolar reference transistor 72 are electrically connected in a negative feedback loop, and the amplifier 73 can control the voltage level of the bias voltage $V_{BIAS}$ to control the error current $I_{ERROR}$ to be about equal to 0 mA, which can correspond to an operating condition in which the collector current $I_C$ is about equal to the reference current $I_{REF}$.

In certain configurations, the amplifier 73 is a transimpedance amplifier configured to amplify the error current $I_{ERROR}$ to generate the bias voltage $V_{BIAS}$. However, other configurations are possible, including, for example, implementations in which the amplifier 73 includes a current-to-voltage converter and an operational amplifier arranged in a cascade.

In the illustrated configuration, the bias circuit 55 is configured to receive an enabled signal ENABLE, which can be used to selectively pulse the output of the power amplifier 32 based on the enable signal's state. For example, when the power amplifier 32 is configured to transmit a WLAN signal, such as a Wi-Fi signal, the enable signal ENABLE can be selectively controlled so as to pulse the output of the power amplifier 32. In certain configurations, the amplifier 73 and/or the current source 71 are selectively activated or turned on and off using the enable signal ENABLE. Configuring the bias circuit 55 in this manner can aid in controlling the voltage level of the bias voltage $V_{BIAS}$ so as to pulse the power amplifier's output. Although the current source 71 and the amplifier 73 both receive the enable signal ENABLE in the illustrated configuration, other implementations are possible.

Absent compensation, the gain and/or phase of the power amplifier 32 can change over time. For example, the power amplifier's gain and/or phase can change based on thermal effects and/or the level of the power high voltage $V_{CC}$, which can vary depending on a battery charge level of the wireless device that the power amplifier 32 and the power amplifier bias circuit 55 are used in. The power amplifier bias circuit 55 can be used to compensate for a gain and/or phase variation of the power amplifier 32 arising from such sources, as well as from other sources.

For example, in certain implementations, the bipolar reference transistor 72 can be configured to be a scaled replica of the bipolar power amplifier transistor 61. Additionally, the feedback loop associated with the amplifier 73 and the bipolar reference transistor 72 can result in the amplifier 73 controlling the voltage level of the bias voltage $V_{BIAS}$ such that the collector current $I_C$ of the bipolar reference transistor 72 is about equal to the reference current $I_{REF}$. Since the bipolar reference transistor 72 can be a scaled replica of the bipolar power amplifier transistor 61 and can receive the bias voltage $V_{BIAS}$, or a modified version thereof, a bias current of the bipolar power amplifier transistor 61 can change in relation to the reference current $I_{REF}$.

For example, in certain configurations, the bias circuit 55 can be used to control a bias current of the bipolar power amplifier transistor 61 to be about equal to $n*I_{REF}$, where n is a factor corresponding to a scaling ratio between the bipolar power amplifier transistor 61 and the bipolar reference transistor 72. In certain implementations, the bipolar reference transistor 72 can be a factor of n smaller than the bipolar power amplifier transistor 61 to reduce static power dissipation of the bias circuit 55 relative to a configuration in which the bipolar reference transistor 72 and the bipolar power amplifier transistor 61 have equal size.

Accordingly, the bias circuit 55 can be used to correct for a variation in gain and/or phase over time that can occur shortly after the power amplifier 32 is enabled. For example, the bias circuit 55 can be used to control the gain and/or phase of the power amplifier 32 to be substantially constant even in the presence of time-dependent thermal changes.

In certain implementations, the bipolar reference transistor 72 and the bipolar power amplifier transistor 61 can be thermally coupled and operate under similar biasing conditions, and thus can have similar temperatures and power densities. By operating the bipolar reference transistor 72 and the bipolar power amplifier transistor 61 with similar temperature and/or power densities, the bias circuit 55 can provide enhanced DEVM compensation. For example, the illustrated configuration can provide enhanced performance relative to a scheme that generates the bias voltage using a current mirror, since such current mirror transistors and the power amplifier transistor can operate with different power densities.

Figure 8:
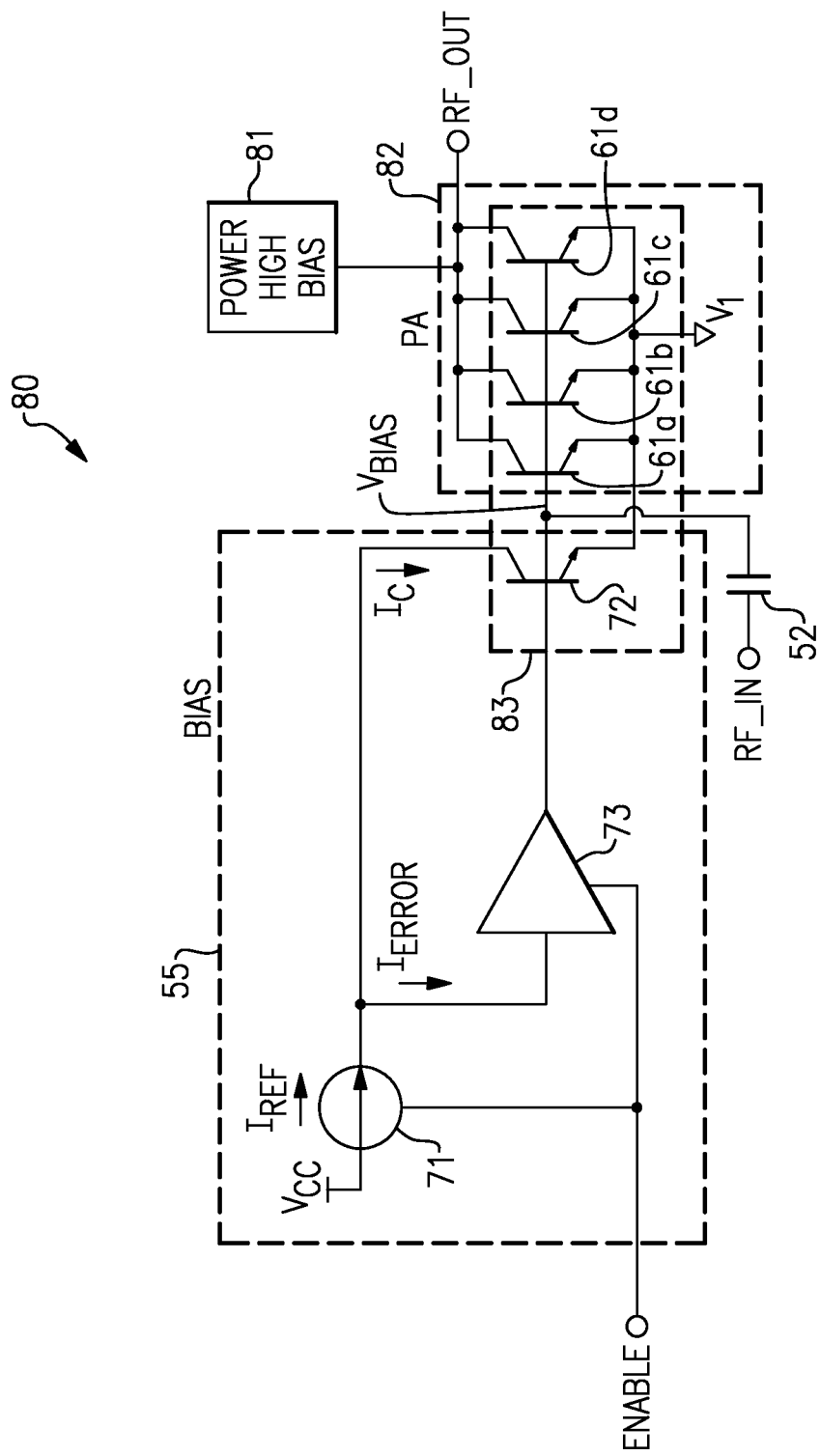
FIG. 8 is a circuit diagram of another embodiment of a power amplifier system.

FIG. 8 is a circuit diagram of a power amplifier system 80 according to another embodiment. The power amplifier system 80 includes the DC blocking capacitor 52 and the bias circuit 55, which can be as described earlier. The power amplifier system 80 further includes a power high bias circuit 81 and a power amplifier 82. The power high bias circuit 81 can be used to provide a power high voltage to the power amplifier 82.

As described earlier, the bias circuit 55 includes the current source 71, the bipolar reference transistor 72, and the amplifier 73. In the illustrated configuration, the bias circuit 55 has been used to generate a bias voltage $V_{BIAS}$ for a power amplifier transistor, which has been implemented using transistor elements 61a-61d selected from a transistor array 83.

In certain implementations, a power amplifier transistor is implemented using a plurality of transistor elements selected from a transistor array, such as the transistor array 83 of FIG. 8. Implementing a power amplifier transistor in this manner can aid in reducing parasitic effects and/or otherwise enhancing the performance of the power amplifier.

In certain configurations, the reference bipolar transistor 72 is also implemented using one or more transistor elements selected from the transistor array 83 used to implement the power amplifier transistor. The transistor elements of the transistor array 83 can be implemented in a common layout with substantially the same geometry and size relative to one another. Implementing the bipolar reference transistor 72 in this manner can improve transistor matching of the bipolar reference transistor 72 and the power amplifier transistor associated with fabrication or processing.

Furthermore, implementing the reference transistor 72 in this manner can also improve thermal coupling between the reference transistor 72 and the power amplifier transistor, which can reduce the power amplifier's gain and/or phase variation associated with thermal mismatch. In one embodiment, to provide robust thermal coupling, the reference transistor 72 and the power amplifier transistor are separated by less than about 9 μm.

Figure 9A:
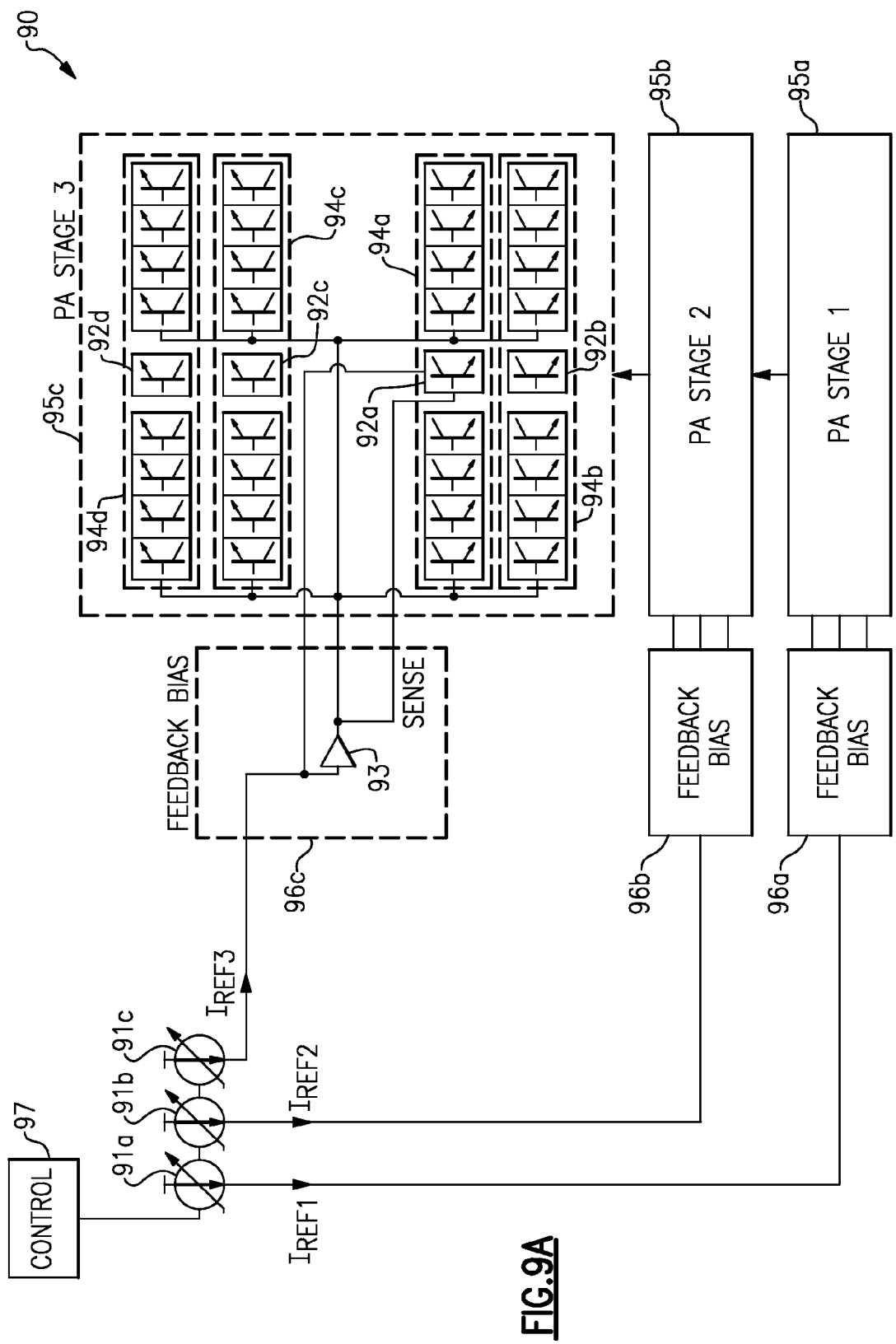
FIG. 9A is a circuit diagram of a multi-stage power amplifier according to one embodiment.

FIG. 9A is a circuit diagram of a multi-stage power amplifier 90 according to one embodiment. The multi-stage power amplifier 90 includes a first variable current source 91a, a second variable current source 91b, a third variable current source 91c, a first power amplifier stage 95a, a second power amplifier stage 95b, a third power amplifier stage 95c, a first feedback bias circuit 96a, a second feedback bias circuit 96b, a third feedback bias circuit 96c, and a control circuit 97.

As schematically illustrated using arrows, the first power amplifier stage 95a, the second power amplifier stage 95b, and the third power amplifier stage 95c are arranged in a cascade. For example, an input of the first power amplifier stage 95a can receive an RF input signal, an input of second power amplifier stage 95b can be electrically connected to the output of the first power amplifier stage 95a, the input of the third power amplifier stage 95c can be electrically connected to the output of the second power amplifier stage 95b, and an output of the third power amplifier stage 95c can generate an amplified RF signal. Although the multi-stage power amplifier 90 illustrates a configuration using three power amplifier stages, the multi-stage power amplifier 90 can include more or fewer power amplifier stages.

In the illustrated configuration, the first to third variable current sources 91a-91c are controlled using a control circuit 97. The control circuit 97 can be used to control the first, second, and third variable current sources 91a, 91b, 91c such that the first, second, and third reference currents $I_{REF1}$, $I_{REF2}$, $I_{REF3}$ generated by the current sources have a relatively small variation across temperature. For example, in one embodiment, the control circuit 97 includes a bandgap reference circuit, which can be used to generate a reference signal that is substantially independent of temperature and can be used to control the current sources. In certain configurations, the control circuit 97 receives an enable signal that can be used to selectively pulse the output of the power amplifier.

As shown in FIG. 9A, the third power amplifier stage 95c includes a plurality of transistor arrays which have been used to implement power amplifier and reference transistors. For example, in the illustrated configuration, the third power amplifier stage 95c includes first to fourth transistor arrays 94a-94d. In the illustrated configuration, the first to fourth reference transistors 92a-92d are implemented within the first to fourth transistors arrays 94a-94d, respectively. Additionally, at least a portion of the remaining transistor elements of the first to fourth transistor arrays 94a-94d can be electrically connected to one another to operate as a bipolar power amplifier transistor associated with the third power amplifier stage 95c. Electrical connections associated with the array of transistors 61a-61d have been omitted for clarity of the figures.

In the configuration shown in FIG. 9A, each power amplifier stage 95a-95c is biased in part using a feedback bias circuit. For example, the third feedback bias circuit 96c includes a transimpedance amplifier 93, which can be used to generate a bias voltage for the power amplifier transistor of the third power amplifier stage 95c. The transimpedance amplifier 93 can generate a bias voltage for the third power amplifier stage 95c based on amplifying an error current corresponding to a difference between the third reference current $I_{REF3}$ and a collector current of the first reference transistor 92a. Since the transimpedance amplifier 93 operates with negative feedback, the transimpedance amplifier 93 can control the collector current of the first reference transistor 92a to be substantially equal to the third reference current $I_{REF3}$ generated by the third variable current source 91c.

In certain implementations, selection circuitry (not illustrated in FIG. 9A) such as multiplexers can be used to selectively connect one of the first to fourth reference transistors 92a-92d to the third feedback bias circuit 96c. For example, as shown in FIG. 9A, the collector of the first reference transistor 92a has been electrically connected to an input of the transimpedance amplifier 93, and the base of the first reference transistor 92a has been electrically connected to an output of the transimpedance amplifier 93. By including a plurality of reference transistors, a reference transistor that best tracks a thermal temperature of the power amplifier stage can be used for generating the stage's bias voltage.

In another implementation, a bias voltage for a power amplifier stage can be generated using multiple reference transistors. For example, two or more of the reference transistors can be electrically connected in parallel and to the third feedback circuit 96c such that the bias voltage generated for the power amplifier stage is based on an average of the reference transistors. The two or more of the reference transistors can be selected using selection circuitry (not illustrated in FIG. 9A) or electrically connected in parallel using interconnect.

Although not illustrated in FIG. 9A for clarity, the first and second power amplifier stages 95a, 95b can include circuitry similar to the third power amplifier stage 95c. Additionally, the first and second feedback bias circuits 96a, 96b can include circuitry similar to that of the third feedback bias circuit 96c. Although FIG. 9A illustrates a configuration in which each power amplifier stage of the multi-stage power amplifier is biased using a feedback bias circuit, the teachings herein are applicable to configurations in which less than all of a power amplifier's stages use a feedback bias circuit. For example, in certain configurations, only an output stage of a power amplifier is biased using a feedback bias circuit.

Figure 9B:
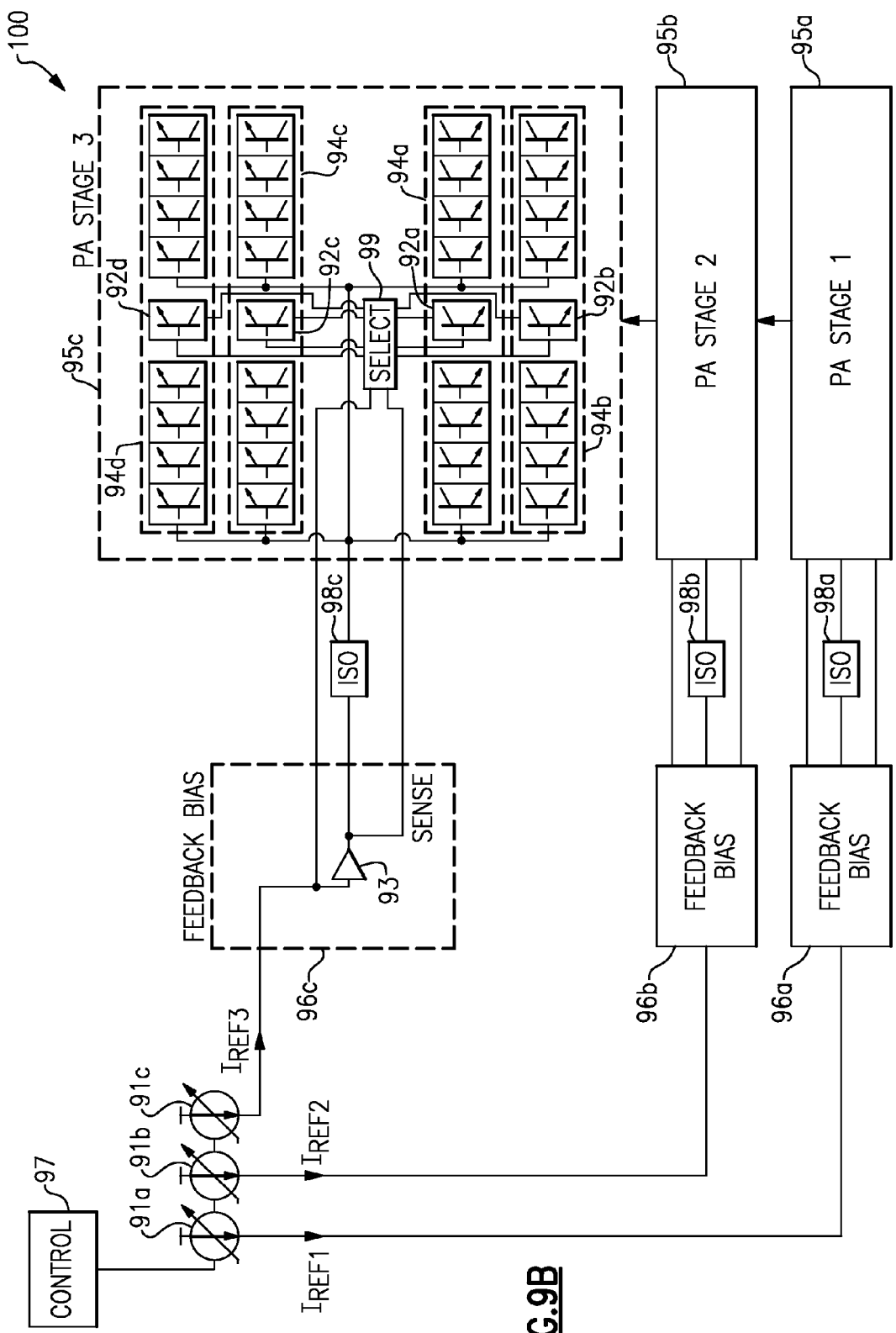
FIG. 9B is a circuit diagram of a multi-stage power amplifier according to another embodiment.

FIG. 9B is a circuit diagram of a multi-stage power amplifier 100 according to another embodiment. The multi-stage power amplifier 100 of FIG. 9B is similar to the multi-stage power amplifier 90 of FIG. 9A, except that the multi-stage power amplifier 100 further includes a first isolation circuit 98a, a second isolation circuit 98b, and a third isolation circuit 98c.

Additionally, the third power amplifier stage 95c is illustrated as including a selection circuit 99, which can be used to selectively connect one or more of the first reference transistor 92a, the second reference transistor 92b, the third reference transistor 92c, and/or the fourth reference transistor 92d to the third feedback bias circuit 96c. In configurations in which more than one reference transistor is selected, the selected reference transistors can be electrically connected in parallel with one another such that the bias voltage generated for the third power amplifier stage 100 is based on an average of the selected reference transistors.

The first to third isolation circuits 98a-98c can be used to provide bias voltages to the power amplifier transistors while helping to prevent noise from reaching the bias circuit. In one embodiment, the third isolation circuit 98c comprises at least one of an inductor or a resistor. Similarly, in certain configurations, the first and second isolation circuits 98a, 98b can each comprise at least one of an inductor or a resistor. Although FIG. 9B illustrates a configuration in which an isolation circuit is included for each power amplifier stage, in other configurations, an isolation circuit is included for less than all power amplifier stages.

Figure 10A:
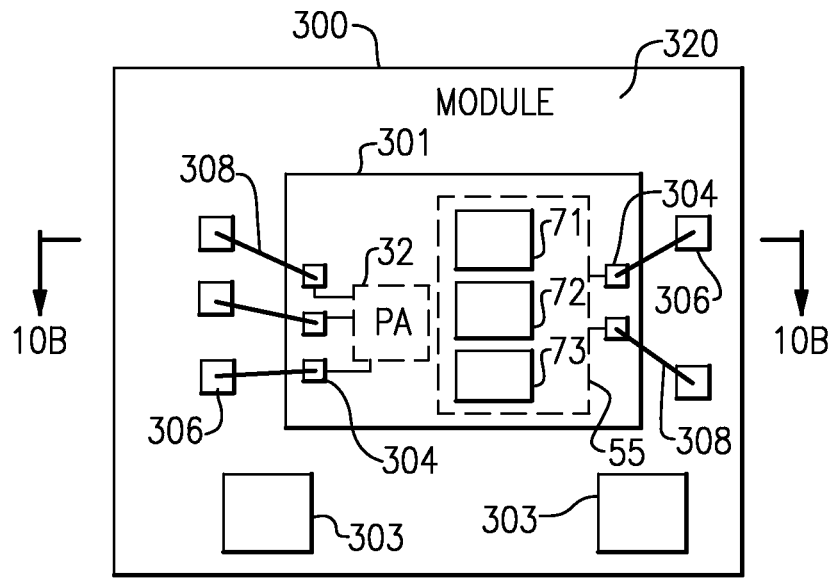
FIG. 10A is a schematic diagram of one embodiment of a packaged power amplifier module.
Figure 10B:
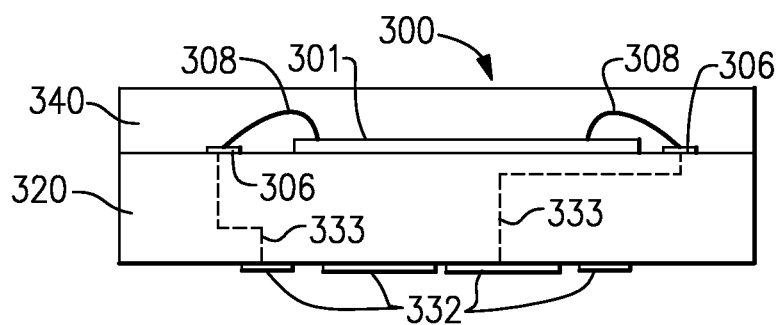
FIG. 10B is a schematic diagram of a cross-section of the packaged power amplifier module of FIG. 10A taken along the lines 10B-10B.

FIG. 10A is a schematic diagram of one embodiment of a packaged power amplifier module 300. FIG. 10B is a schematic diagram of a cross-section of the packaged power amplifier module 300 of FIG. 10A taken along the lines 10B-10B.

The packaged power amplifier module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 10A and 10B, the die 301 includes the power amplifier 32 and the power amplifier bias circuit 55 formed therein. The power amplifier bias circuit 55 includes the current source 71, the reference transistor 72, and the power amplifier 73, which can be as described earlier.

The packaging substrate 320 can be configured to receive a plurality of components such as the die 301 and the surface mount components 303, which can include, for example, surface mount capacitors and/or inductors.

As shown in FIG. 10B, the packaged power amplifier module 300 is shown to include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 10B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged power amplifier module 300 can also include one or more packaging structures to, for example, provide protection and/or to facilitate handling of the packaged power amplifier module 300. Such a packaging structure can include overmold or encapsulation structure 340 formed over the packaging substrate 320 and the components and die(s) disposed thereon.

It will be understood that although the packaged power amplifier module 300 is described in the context of electrical connections based on wirebonds, one or more features of the present disclosure can also be implemented in other packaging configurations, including, for example, flip-chip configurations.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to receive a radio frequency (RF) input signal, and to amplify the RF input signal to generate an RF output signal, the power amplifier further configured to receive a bias voltage that biases the power amplifier; and
a bias circuit configured to generate the bias voltage, the bias circuit including a bias circuit amplifier, a variable current source configured to generate a reference current, and a reference transistor having a current therethrough that changes in relation to the bias voltage, the bias circuit amplifier configured to control the bias voltage based on an error current corresponding to a difference between the reference current and the current through the reference transistor.

2. The power amplifier system of claim 1 wherein the bias circuit amplifier includes a transimpedance amplifier.

3. The power amplifier system of claim 1 wherein the bias circuit is configured to receive an enable signal, the bias circuit configured to selectively turn on or off the power amplifier based on a state of the enable signal.

4. The power amplifier system of claim 3 wherein at least one of the bias circuit amplifier or the variable current source turn on or off based on the state of the enable signal.

5. The power amplifier system of claim 1 further comprising a control circuit configured to control the reference current generated by the variable current source to compensate for temperature variation.

6. A power amplifier system comprising:
a power amplifier configured to receive a radio frequency (RF) input signal, and to amplify the RF input signal to generate an RF output signal, the power amplifier further configured to receive a bias voltage that biases the power amplifier, the power amplifier including a bipolar power amplifier transistor including a base that receives the bias voltage;
a bias circuit configured to generate the bias voltage, the bias circuit including a bias circuit amplifier, a current source configured to generate a reference current, and a reference transistor having a current therethrough that changes in relation to the bias voltage, the bias circuit amplifier configured to control the bias voltage based on an error current corresponding to a difference between the reference current and the current through the reference transistor; and
an isolation circuit electrically connected between the base of the bipolar power amplifier transistor and an output of the bias circuit amplifier.

7. The power amplifier system of claim 6 further comprising an array of transistor elements, the bipolar power amplifier transistor implemented by a plurality of transistor elements of the array, the reference transistor implemented by one or more transistor elements of the array.

8. The power amplifier system of claim 6 wherein the bipolar power amplifier transistor and the reference transistor are separated by a distance of less than about 9 $\mu$m to provide thermal coupling.

9. The power amplifier system of claim 6 wherein the bias circuit amplifier includes a transimpedance amplifier.

10. The power amplifier system of claim 6 wherein the bias circuit is configured to receive an enable signal, the bias circuit configured to selectively turn on or off the power amplifier based on a state of the enable signal.

11. The power amplifier system of claim 10 wherein at least one of the bias circuit amplifier or the current source turn on or off based on the state of the enable signal.

12. A power amplifier system comprising:
a power amplifier configured to receive a radio frequency (RF) input signal, and to amplify the RF input signal to generate an RF output signal, the power amplifier further configured to receive a bias voltage that biases the power amplifier, the power amplifier including a plurality of power amplifier stages arranged in a cascade; and
a bias circuit configured to generate the bias voltage, the bias circuit including a bias circuit amplifier, a current source configured to generate a reference current, and a reference transistor having a current therethrough that changes in relation to the bias voltage, the bias circuit amplifier configured to control the bias voltage based on an error current corresponding to a difference between the reference current and the current through the reference transistor.

13. The power amplifier system of claim 12 wherein the current source is a variable current source.

14. The power amplifier system of claim 12 wherein the bias circuit amplifier includes a transimpedance amplifier.

15. The power amplifier system of claim 12 wherein the bias circuit is configured to receive an enable signal, the bias circuit configured to selectively turn on or off the power amplifier based on a state of the enable signal.

16. The power amplifier system of claim 15 wherein at least one of the bias circuit amplifier or the current source turn on or off based on the state of the enable signal.

17. A power amplifier bias circuit for biasing a power amplifier, the power amplifier bias circuit comprising:
a bias circuit amplifier;
a variable current source configured to generate a reference current; and
a reference transistor having a current therethrough that changes in relation to a bias voltage, the bias circuit amplifier configured to control the bias voltage based on an error current corresponding to a difference between the reference current and the current through the reference transistor.

18. The power amplifier bias circuit of claim 17 wherein the bias circuit amplifier includes a transimpedance amplifier.

19. The power amplifier bias circuit of claim 17 further comprising a control circuit configured to control the reference current generated by the variable current source to compensate for temperature variation.

20. The power amplifier bias circuit of claim 17 wherein at least one of the bias circuit amplifier or the variable current source are turned on or off using an enable signal.

* * * * *